(12) United States Patent  (10) Patent No.: US 7,526,259 B2
Yamaguchi  (45) Date of Patent: *Apr. 28, 2009

(54) RADIO FREQUENCY CIRCUIT AND COMMUNICATION SYSTEM WITH POWER AMPLIFIER CONTROL

(75) Inventor: Keiichi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 671 days.

This patent is subject to a terminal disclaimer.

(21) Appl. No.: 11/233,000

(22) Filed: Sep. 23, 2005

(65) Prior Publication Data

US 2006/0019621 A1  Jan. 26, 2006

Related U.S. Application Data

(62) Division of application No. 10/131,189, filed on Apr. 25, 2002, now Pat. No. 7,046,974.

(30) Foreign Application Priority Data

Apr. 25, 2001  (JP) ............................. 2001-127133

(51) Int. Cl.
  *H04B 1/04*  (2006.01)
  *H04Q 7/20*  (2006.01)
(52) U.S. Cl. .................... 455/127.1; 330/285
(58) Field of Classification Search ... 455/127.1–127.5; 330/127, 285
  See application file for complete search history.

(56) References Cited

U.S. PATENT DOCUMENTS

| 4,885,798 | A | 12/1989 | Jinich et al. |
| 5,136,257 | A | 8/1992 | Reading |
| 5,250,912 | A | 10/1993 | Fujita |
| 5,532,646 | A | 7/1996 | Aihara |
| 5,625,322 | A | 4/1997 | Gourgue et al. |
| 5,732,334 | A | 3/1998 | Miyake |
| 6,148,220 | A | 11/2000 | Sharp et al. |
| 6,178,313 | B1 | 1/2001 | Mages et al. |
| 6,298,222 | B1 | 10/2001 | Bergveld et al. |
| 6,327,462 | B1 | 12/2001 | Loke et al. |
| 6,404,287 | B2 | 6/2002 | Dening et al. |
| 6,681,100 | B1 | 1/2004 | Ge |
| 6,791,418 | B2 | 9/2004 | Luo et al. |
| 6,806,774 | B2 | 10/2004 | Sakuno |
| 2004/0150473 | A1 | 8/2004 | Hollingsworth et al. |

FOREIGN PATENT DOCUMENTS

| DE | 197 18 109 | 11/1997 |
| EP | 0 996 224 | 4/2000 |

(Continued)

*Primary Examiner*—Lee Nguyen
(74) *Attorney, Agent, or Firm*—Oblon, Spivak, McClelland, Maier & Neustadt, P.C.

(57) ABSTRACT

A radio frequency circuit includes a radio frequency signal source which produces a radio frequency signal, a power amplifier which power amplifies the radio frequency signal from the radio frequency signal source, and a control unit which controls an output power of the power amplifier. Particularly, the control unit is configured to hold control data defining a relationship among an output power, a gain, and an operation bias point of the power amplifier and adjust the operation bias point of the power amplifier based on the control data such that the output power of the power amplifier is set into a level designated by an external power designating instruction.

9 Claims, 9 Drawing Sheets

FOREIGN PATENT DOCUMENTS

| | | |
|---|---|---|
| GB | 2 323 987 | 10/1998 |
| JP | 1-98304 | 4/1989 |
| JP | 5-83041 | 4/1993 |
| JP | 5-129860 | 5/1993 |
| JP | 8-51317 | 2/1996 |
| JP | 9-23124 | 1/1997 |
| JP | 9-153823 | 6/1997 |
| JP | 2000-151317 | 5/2000 |
| JP | 2000-201027 | 7/2000 |

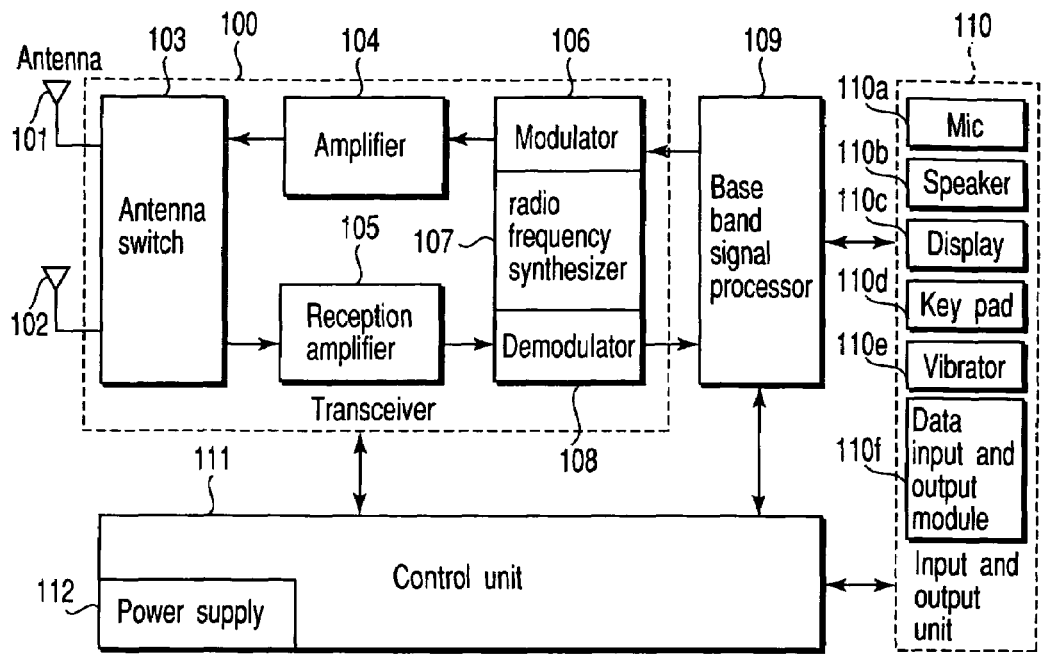
F I G. 7A
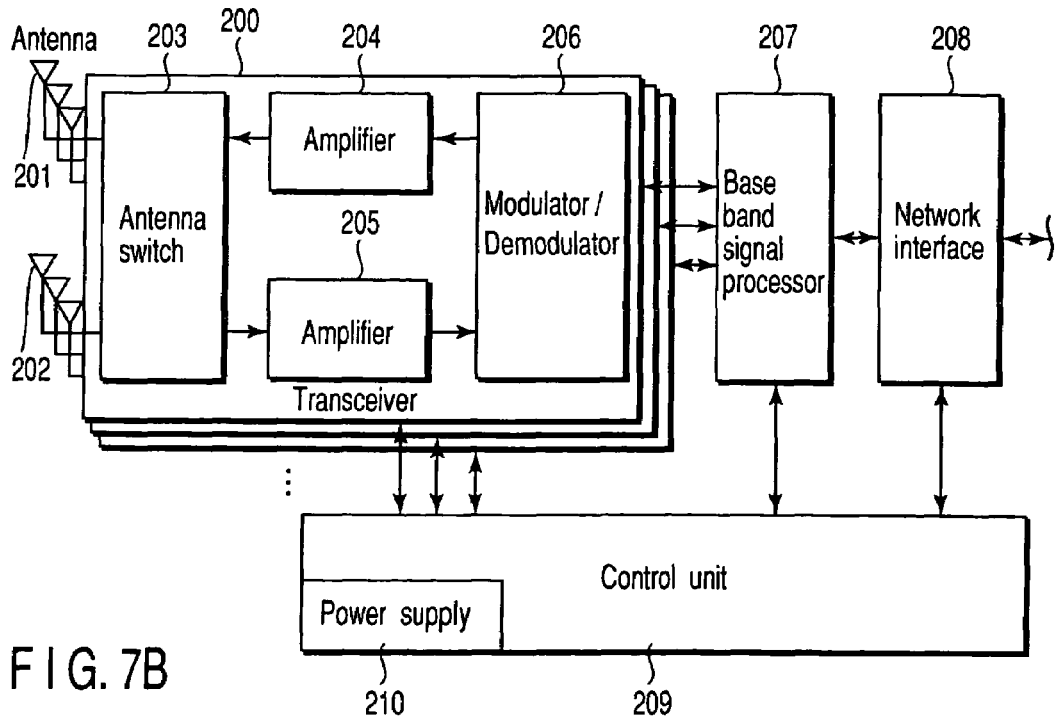
F I G. 7B

RADIO FREQUENCY CIRCUIT AND COMMUNICATION SYSTEM WITH POWER AMPLIFIER CONTROL

CROSS-REFERENCE TO RELATED APPLICATIONS

This application is based upon and claims the benefit of priority from the prior Japanese Patent Application No. 2001-127133 filed Apr. 25, 2001, the entire contents of which are incorporated herein by reference.

BACKGROUND OF THE INVENTION

1. Field of the Invention

The present invention relates to a radio frequency circuit which controls the output power of a radio frequency signal in power amplification and a communication system equipped with that radio frequency circuit.

2. Description of the Related Art

In view of reduction in power consumption, transmission power is controlled in many radio communication systems including a mobile communication system. However, when the output power is lowered, degradation of the power addition efficiency η add occurs in the main power amplifier and a driver amplifier located at a preceding stage of the main power amplifier. The power addition efficiency η add can be obtained as a result of dividing a difference between the RF input power $P_{rfin}$ and the RF output power $P_{rfout}$ by the DC input power $P_{dcin}$. That is, η add=$(P_{rfout}-P_{rfin})/P_{dcin}$.

FIG. 15A shows a conventional radio frequency circuit which can compensate for degradation of the power addition efficiency. That is, the bias voltage is adjusted to lower the output power, appropriately. For example, when the output power is lowered to ¼, the bias voltage is changed from B2 to B1 as shown in FIG. 15B. However, the radio frequency circuit requires a variable voltage source V1 capable of providing a large current. In general, a DC-DC converter shown in FIG. 15C is used as the variable voltage source V1, thus increasing the number of components, the mounting area thereof, and the cost. Further, in this ratio frequency circuit, it difficult to maintain the efficiency because the proportion of the knee voltage to the bias voltage increases as the output power drops. Moreover, it is difficult to maintain a high efficiency over a wide range of output power because the minimum output voltage of the variable voltage source V1 is of the order of 1 V in association with the reference voltage of the internal regulator and the efficiency of the DC-DC converter drops at low output voltages. In the radio frequency circuit, a variable voltage source V2 is also used for controlling the bias current, which becomes an idle current at zero signal input. However, the bias current is adjusted such that the power gain of the power amplifier remains unchanged as much as possible even at low output levels because the radio frequency circuit is provided for the purpose of keeping the power addition efficiency from decreasing with decreasing output power.

A method, in which a fixed voltage source is used instead of the variable voltage source V1 shown in FIG. 15A, has been also proposed. With the method, only the bias current is controlled by the variable voltage source V2 under the fixed bias voltage. However, the bias current is adjusted such that the power gain of the power amplifier remains unchanged as much as possible even at low output levels because the radio frequency circuit of this method is also provided for the purpose of keeping the power addition efficiency from decreasing with decreasing output power. For example, when the power amplifier includes two stages of amplification to attain the power gain of about 24 dB at maximum output, the bias point is adjusted such that the power gain is maintained at about 21 dB at low output levels as well.

The principle of the conventional method that controls only the bias current based on the variable voltage source V2 will be described. FIG. 8 shows the relationship between the output power of the power amplifier and the ratio of an undesired signal component to a desired signal component (hereinafter referred to as the U/D ratio) in an RF signal output from the power amplifier. The undesired signal is produced due to non-linearity of the power amplifier. Generally, the voltage source V2 is fixed to a voltage value causing that the U/D ratio shifts with a constant margin with respect to the reference value R upon an increase of the output power of the power amplifier and exceeds the reference value R at maximum output power P as shown in FIG. 8. When the amplifier bias point of V2 is set to a value nearer the class B area than the fixed value, the characteristic curve of the U/D ratio to the output power as a whole will move upward in FIG. 8 with a slight change in shape. If a desired output power is lower than the maximum output power P, the power addition efficiency can be compensated for by adjusting the bias point of V2 to a value near the class B area in a range that the U/D ratio to the output power as a whole does not exceed the reference value R.

A radio frequency circuit shown in FIG. 14 is uses as another means for compensating for deterioration of the power addition efficiency. With this radio frequency circuit, power amplifiers different in maximum output power, AMP1 (maximum output power: −20 dBmW), AMP2 (5 dBmW) and AMP3 (3 dBmW), are arranged in series via switch circuits S71, S72, S73 and S74, and bypass circuits 75 and 76 are arranged in parallel with the power amplifiers AMP2 and AMP3, respectively. The switch circuits S71, S72, S73 and S74 perform switching between the power amplifier AMP2 and bypass circuit 75 and between the amplifier AMP3 and bypass circuit 76 so as to change the configuration of signal paths behind the power amplifier AMP1.

This radio frequency circuit operates to disconnect unnecessary power amplifiers at low output power levels and reduce the idle current dissipated by the power amplifiers. Assume that the switches S71 to S74 and the bypass circuits 75 and 76 are free from loss. To provide output power higher than 5 dBmW, the amplifiers AMP1, AMP2, and AMP3 will be required. However, the amplifier AMP3 may be unnecessary and disconnected when the output power is not higher than 5 dBmW. Likewise, both the amplifiers AMP2 and AMP3 can be unnecessary and disconnected when the output power is not higher than −20 dBmW. Thus, the idle current dissipated by at least one of the amplifiers AMP2 and AMP3 can be reduced when the output power is below 5 dBmW.

However, although the switch-based method as shown in FIG. 14 is straightforward, the insertion loss of each of the switches becomes a problem. In particular, the insertion loss of the switch S74 at the output of the final-stage amplifier AMP3 greatly reduces the power addition efficiency. Assuming the insertion loss of each switch to be 1 dB, the output power of the amplifier AMP3 must be 31 dBmW. If the power addition efficiency of the amplifier AMP3 is 40% at maximum output and the supply voltage and the power gain of the amplifier AMP3 are 3.5 V and 25 dB, the consumption current will be 896 mA. In the absence of the switch, the radio frequency circuit has only to produce an output power of 30 dBmW. The consumption current will be 712 mA in the case where the power addition efficiency is 40%, the supply voltage is 3.5 V and the power gain is 25 dB. The insertion of a switch having an insertion loss of 1 dB at the output of the amplifier AMP3 results in an increase of consumption current by 1.26 times. This is nothing else but to increase the device size by 1.26 times in order to increase the output power by 1 dB. The consumption current is increased by 1.26 times over the whole range of output power. Naturally, the idle current is also increased by 1.26 times. To compensate for 1 dB of insertion loss of each of the switches S72 and S73 between the amplifiers AMP2 and AMP3, the amplifier AMP2 is required to compensate for a total of 3 dB including the insertion loss of the switch S74. In many cases, more stringent distortion criteria are imposed on the amplifier AMP2 than on the amplifier AMP3 and, to ensure linearity, the power addition efficiency generally becomes low, of the order of 4%. Assuming that the output power, the power addition efficiency, the supply voltage and the power gain of the amplifier AMP2 are 8 dBmW, 4%, 3 V and 25 dB, respectively, the consumption current will become 52.4 mA. Assuming that the switches S73 and S74 are removed and the amplifier AMP3 is connected at all times, the amplifier AMP2 has only to provide an output power of 6 dBmW, requiring the consumption current to be as low as 33.1 mA. This current corresponds to 63% of that when the amplifier AMP3 is bypassed. Further, the consumption current is reduced to 78% in total when the amplifiers AMP2 and AMP3 are bypassed.

Although the switch-based bypassing method apparently seems to be simple and effective, the consumption current increases greatly with increasing output power. Thus, as a conventional manner, the bypass circuit 75 of the amplifier AMP2 is used positively while the bypass circuit 76 of the amplifier AMP3 is little used. The provision of switches also causes a problem of an increase in the number of components, the mounting area thereof, and the signal distortion.

BRIEF SUMMARY OF THE INVENTION

It is an object of the present invention to provide a radio frequency circuit which can provide a wide dynamic range while reducing substantial DC consumption power without increasing the total mounting area and the number of components.

According to an aspect of the present invention, there is provided a radio frequency circuit comprising: a radio frequency signal source which produces a radio frequency signal; a power amplifier which power amplifies the radio frequency signal from the radio frequency signal source; and a control unit which controls an output power of the power amplifier, wherein the control unit is configured to hold control data defining a relationship among an output power, a gain, and an operation bias point of the power amplifier and adjust the operation bias point of the power amplifier based on the control data such that the output power of the power amplifier is set into a level designated by an external power designating instruction.

Further, according to another aspect of the present invention, there is provided a communication system comprising: a radio frequency circuit which includes a radio frequency signal source which produces a radio frequency signal, a power amplifier which power amplifies the radio frequency signal from the radio frequency signal source, and a control unit which controls an output power of the power amplifier; and an antenna which radiates the radio frequency signal output from the power amplifier of the radio frequency circuit; wherein the control unit is configured to hold control data defining a relationship among an output power, a gain, and an operation bias point of the power amplifier and adjust the operation bias point of the power amplifier based on the control data such that the output power of the power amplifier is set into a level designated by an external power designating instruction.

With the radio frequency circuit and the communication system, the control unit holds control data defining a relationship among an output power, a gain, and an operation bias point of the power amplifier and adjusts the operation bias point of the power amplifier based on the control data such that the output power of the power amplifier is set into a level designated by an external power designating instruction. In such a structure, the gain of the power amplifier can be reduced when the output power of the power amplifier is lowered. Thus, a wide dynamic range can be obtained without increasing the total mounting area and the number of components and reduce substantial DC consumption current such as an idle current which flows in the power amplifier when no signal is input thereto. In addition, the substantial DC consumption current can be significantly reduced if the power amplifier becomes to a state where the radio frequency signal passes though with no power gain.

Although transmission power is generally monitored in communication system to produce a transmission power control signal, the present invention can be achieved regardless of monitoring of the transmission power.

BRIEF DESCRIPTION OF THE SEVERAL VIEWS OF THE DRAWING

FIGS. 7A and 7B are block diagrams showing examples where the radio frequency circuit shown in FIG. 1 is applied to a terminal device and a base station device for a mobile communication system, respectively;

DETAILED DESCRIPTION OF THE INVENTION

A radio frequency circuit according to one embodiment of the present invention will be described with reference to the accompanying drawings. The radio frequency circuit is used for power amplifying a radio frequency signal for transmission and widely controlling the output power of the radio frequency signal in a radio communication system.

Initially, a typical power control and degradation in power addition efficiency caused when the output power is lowered by the control will be described, so that the operation principle of the radio frequency circuit can be easily understand. Here, the power addition efficiency is defined as the RF (Radio Frequency) output power divided by the DC (Direct Current) input power.

Figure 9:
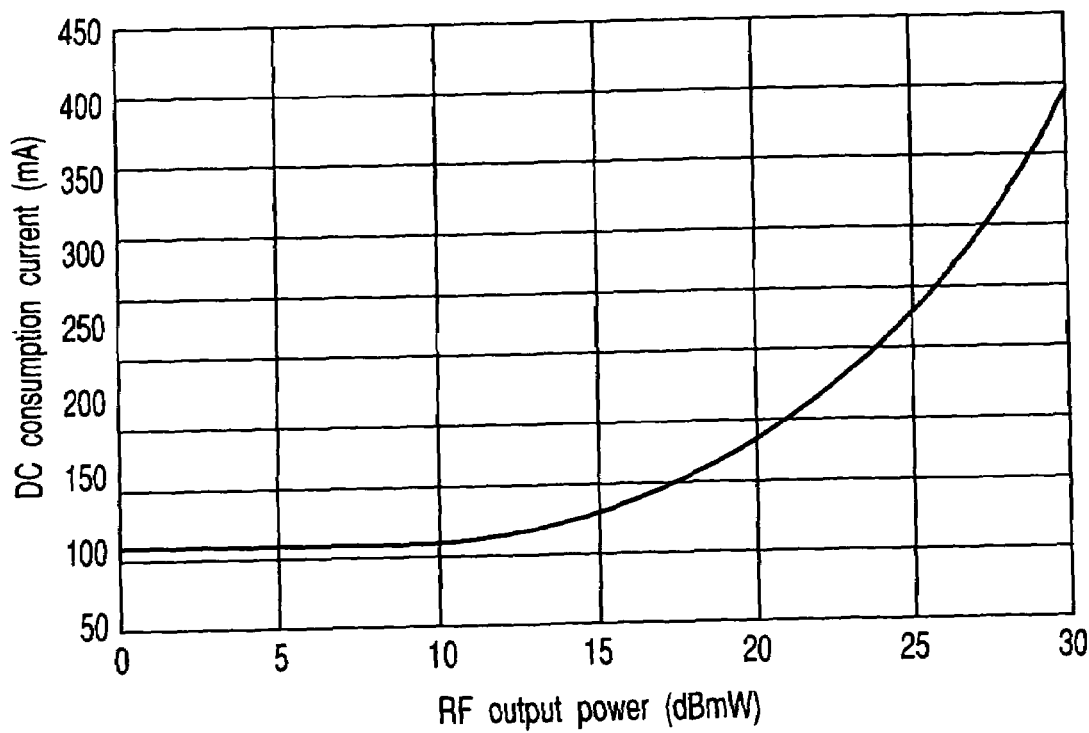
FIG. 9 is a graph showing a relationship between the DC consumption current and the RF output power of a general class AB linear amplifier.
Figure 10:
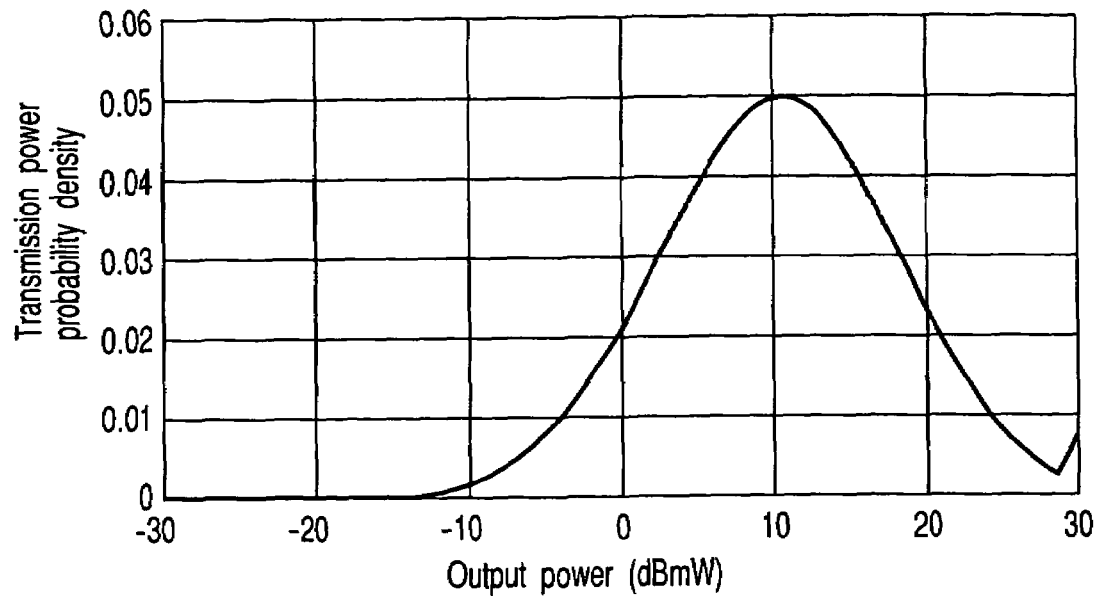
FIG. 10 is a graph showing an example of a probability density function of transmission power in a radio communication system whose transmission power is controlled.

FIG. 9 shows a relationship between the DC consumption current and the RF output power of a general power amplifier biased to operate as a class AB linear amplifier for radio communication. FIG. 10 shows an example of a probability density function of transmission power in a radio communication system whose transmission power is controlled. In this example, the transmission power reaches a maximum of 30 dBmW and the power that is highest in the probability of being transmitted lies in the vicinity of 10 dBmW. The transmission power may take values of less than 0 dBmW.

Referring to FIG. 9, the consumption current seems to increase with increasing RF output power. If the power addition efficiency is constant regardless of the output power, the consumption current of 400 mA at 30 dBmW should be 40 mA at 20 dBmW, which is one-tenth of 400 mA. However, in this example, 130 mA is consumed because the power addition efficiency is degraded as the output power decreases.

With RF output power levels of less than 10 dBmW, the consumption current approaches a finite constant value regardless of the RF output power. In the example of FIG. 9, the consumption current is about 60 mA and called as the idle, set, or quiescent current for biasing the power amplifier to operate as a class AB amplifier.

Figure 11:
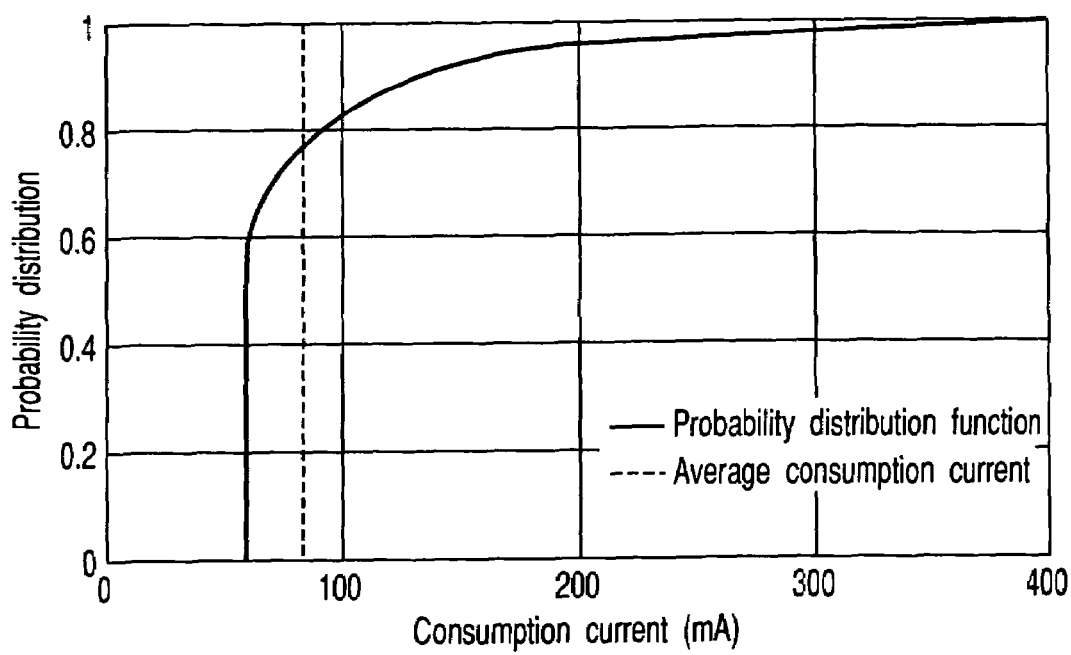
FIG. 11 is a graph showing a probability density function of consumption current derived from the probability density function shown in FIG. 10.

If the power amplifier is biased to operate as a class B amplifier, the consumption current at low output power levels approaches 0. In the case of a power amplifier for linear modulation, it is necessary to suppress distortion by biasing the power amplifier to operate as a class AB amplifier. In the case of the class AB amplifier, useless current that does not contribute to RF power is consumed at low output levels. Applying the probability density function of transmission power shown in FIG. 10 to the relationship between the DC consumption current and the RF output power shown in FIG. 9 results in the probability distribution function of the consumption current, which is indicated by a solid curve in FIG. 11. The dashed line indicates the average consumption current of the order of 84 mA. A current of about 60 mA, which is the idle current, is consumed with a probability of more than 50%. The probability of consumption currents of more than 100 mA is 14%. The probability of consumption currents of more than 200 mA is 3.5%. The probability of consumption currents of more than 300 mA is no more than 1%. From FIG. 11 it is seen that the average consumption current depends on the idle current. With radio communication systems whose transmission power is controlled over a wide range, it is very important to reduce the idle current in the power amplifier.

Figure 12A:
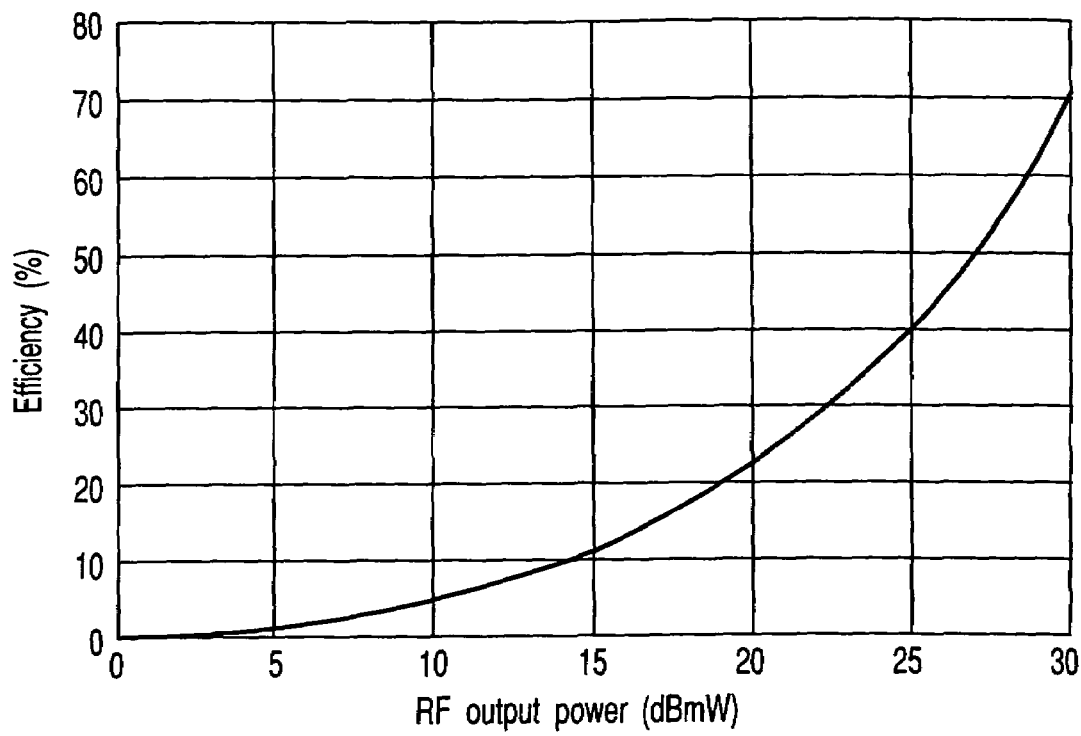
FIGS. 12A and 12B are graphs showing examples of the power addition efficiency and the reciprocal thereof to the output power of a class B power amplifier.
Figure 12B:
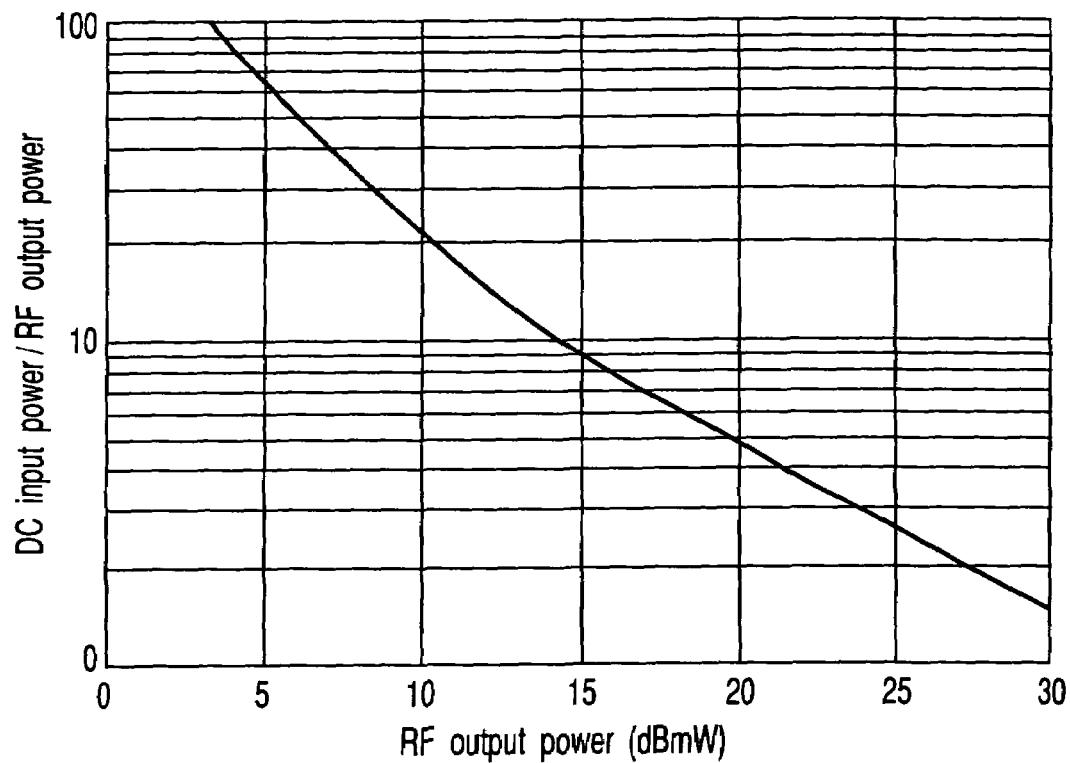

FIG. 12A shows an example of the power addition efficiency to the output power of a class B power amplifier, in which the idle current is zero. As shown in FIG. 12A, the power addition efficiency of the power amplifier becomes maximum in the vicinity of saturated output power and declines at low power levels. As described above, the power addition efficiency is defined as the RF output power divided by the DC input power. Thus, the power addition efficiency corresponds to the collector efficiency in the case of bipolar transistors and the drain efficiency in the case of field effect transistors. FIG. 12B shows the reciprocal of the power addition efficiency of FIG. 12A in logarithmic scale. The ratio of the DC input power to the RF output power of the power amplifier could be seen from FIG. 12B. The power addition efficiency is reduced from 72% at 30 dBmW through 21.8% at 20 dBmW and 4.7% at 10 dBmW down to 1.5% at 5 dBmW. The ratio of the DC input power to the RF output power increases from 1.4 at 30 dBmW through 4.6 at 20 dBmW and 21.2 at 10 dBmW up to 67.1 at 5 dBmW. Thus, useless DC input power that does not contribute to RF output power is consumed at low output power levels.

The principle on which, at low output levels, the power addition efficiency decreases will be described with reference to FIGS. 13A and 13B. It is assumed that the power amplifier is of a simply idealized transistor model. A dynamic load line is obtained by superimposing instantaneous current and voltage values on static characteristics, and represented by a crooked line KBC. The output voltage is represented by a sinusoidal wave whose average value corresponds to the bias voltage. The output current is represented by half-wave rectified waves. The power amplifier performs the class B operation with the bias point indicated by the point B in FIG. 13A. The RF output power is given by the product of the effective value of the fundamental-wave component Vout(t) of the output voltage and the effective value of the fundamental-wave component I1(t) of the output current. Thus, the RF output power corresponds to half the area of the quadrangle surrounded by a dotted line in FIG. 13A with the points R and B used as opposite corners. The DC input power is given by the product of the bias voltage and the average of the output current Iout(t). Thus, the DC input power corresponds to the area of the quadrangle defined by a broken line in FIG. 13A with the points D and B used as opposite corners. If the gain of the power amplifier is sufficiently high, the power addition efficiency corresponds to the ratio in area between both quadrangles. The straight line connecting the points R and B forms the load line for the fundamental wave.

Figure 13A:
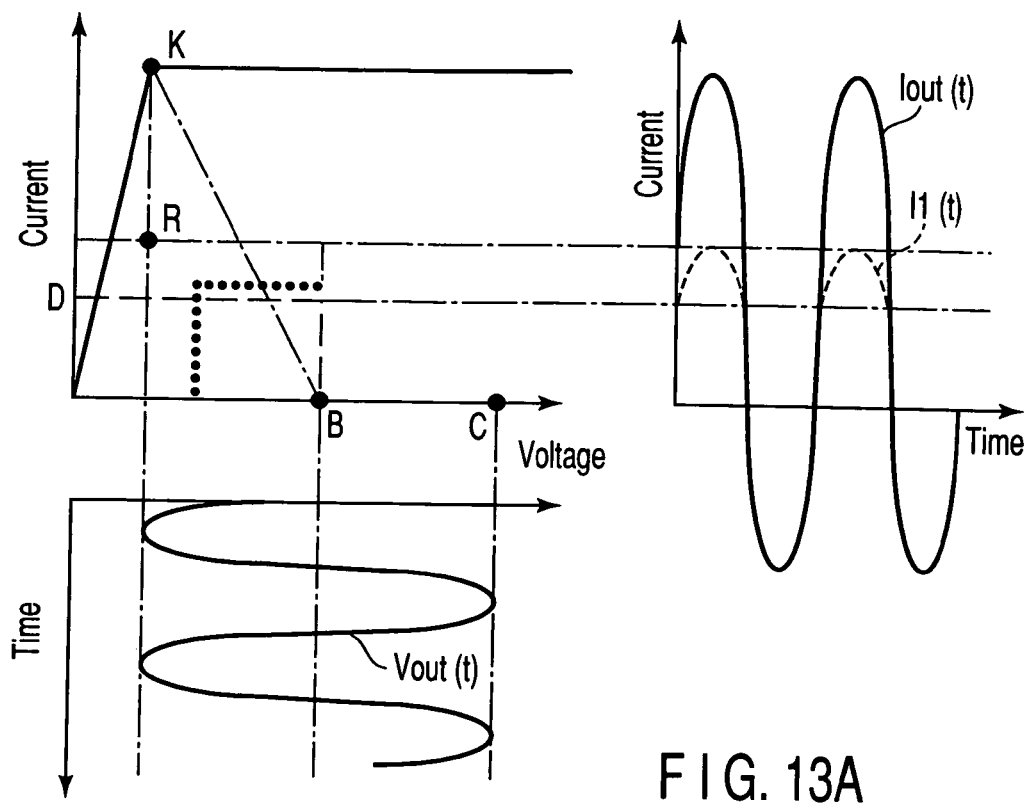
FIGS. 13A and 13B are diagrams for use in explanation of a lowering of the power addition efficiency in the power amplifier at low output power levels.
Figure 13B:
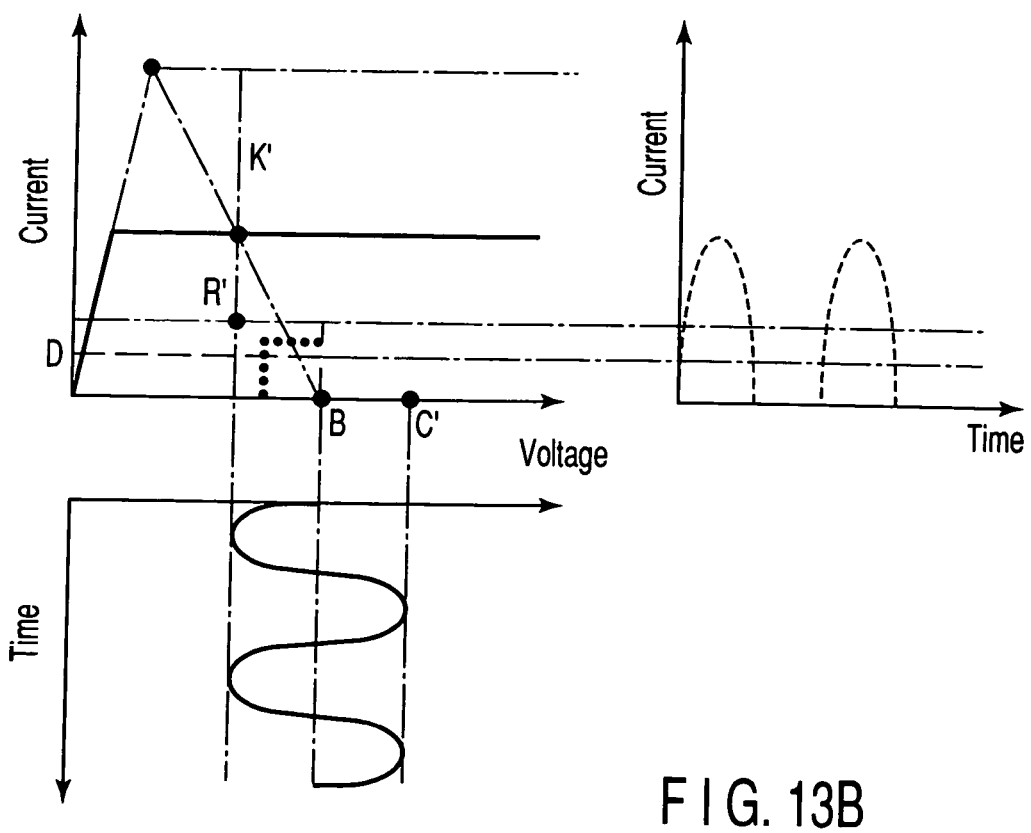
Figure 14:
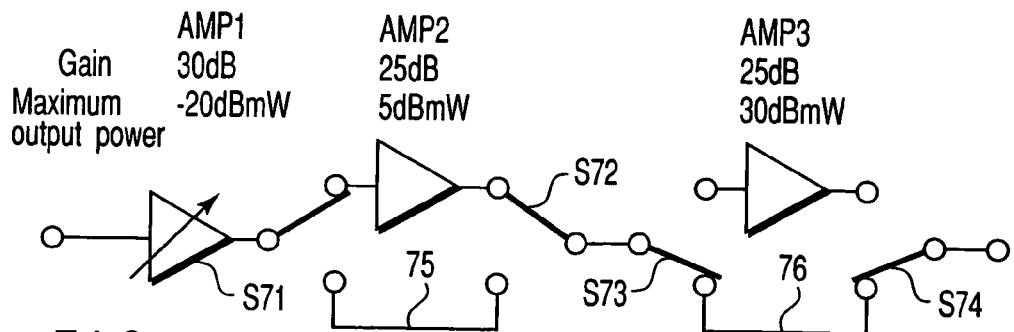
FIG. 14 is a diagram showing a conventional radio frequency circuit.
Figure 15A:
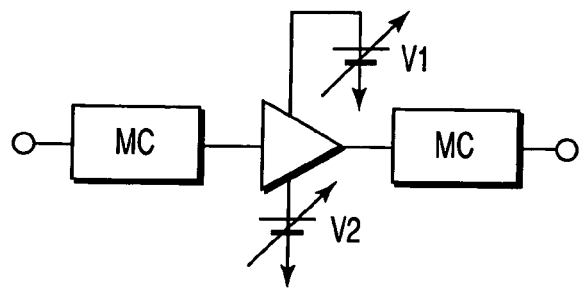
FIGS. 15A, 15B and 15C are diagrams for use in explanation of other conventional radio frequency circuits.
Figure 15B:
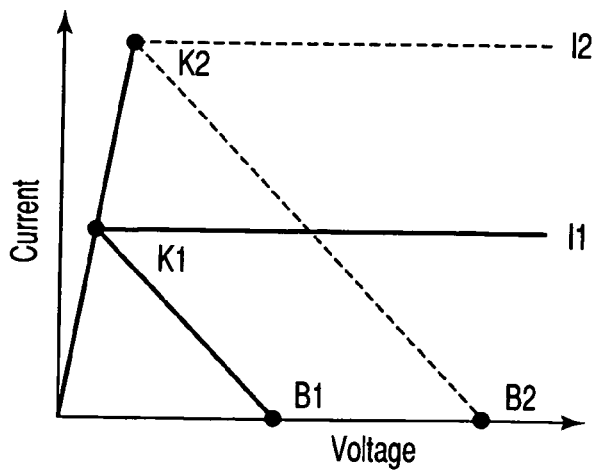
Figure 15C:
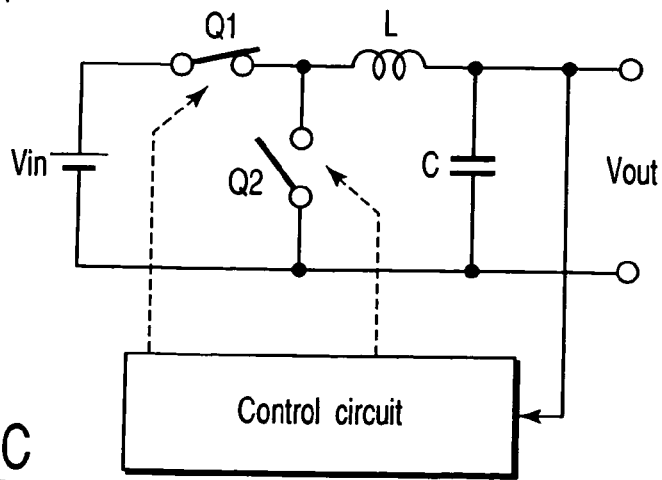

When both the current amplitude and the voltage amplitude are halved from the values shown in FIG. 13A to the values shown in FIG. 13B, the RF output power is reduced to one fourth. On the other hand, the DC current is reduced in the same proportion, i.e., halved because it is the average of the RF current, while the DC voltage is fixed at point B. Therefore, the area of the quadrangle defined with the points D and B used as opposite corners is halved. As a result, the power addition efficiency is halved each time the RF output power is reduced to one fourth (−6 dB). Thus, the power addition efficiency in the power amplifier is degraded at low output power levels.

Figure 8:
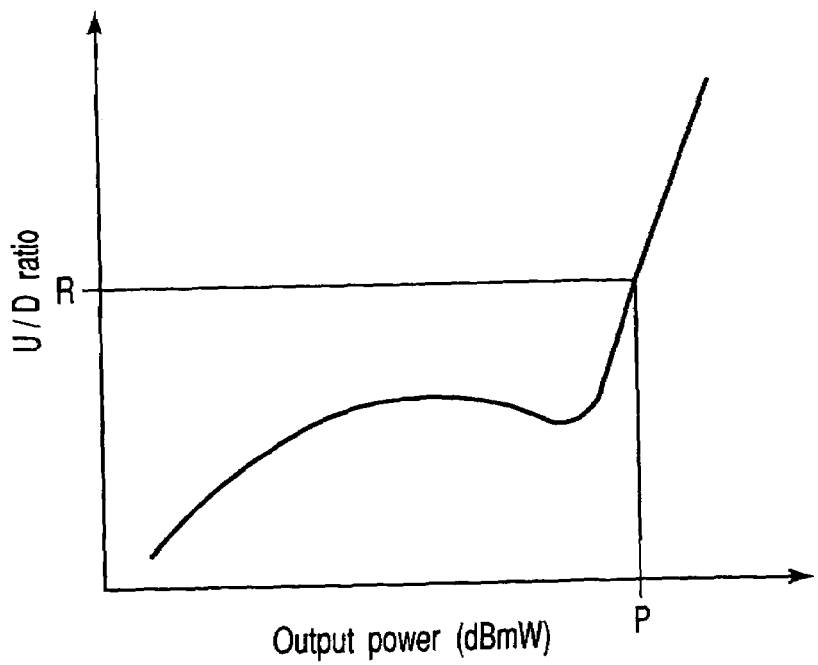
FIG. 8 is a graph showing a relationship between the U/D ratio and the output power of a general class AB linear amplifier.

The principles of the present invention will be described below. FIG. 8 is a graph showing a characteristic curve which represents the relationship between the output power of a general linear RF power amplifier biased to operate as a class AB amplifier and the ratio of an undesired signal component to a desired signal component (hereinafter referred to as the U/D ratio) in an RF signal output from the power amplifier. Here, the undesired signal refers to signal distortions that cause adjacent channel leakage power and third harmonic distortion. Further, EVM (Error Vector Mean) may be caused by signal distortions. However, EVM is not in FIG. 8. These signal distortions are prescribed as important matters in radio communication. In FIG. 8, the U/D ratio is shown oh the vertical axis and the output power is shown on the horizontal axis. As to the undesired signal, a distortion reference value R is set up for each radio communication system used. The allowable distortion is shared among components in the radio communication system to determine the final distortion reference value R for the power amplifier. The power amplifier used is required to meet this distortion reference value. That is, in the power amplifier, the U/D ratio to whole output power maintained to be less than the distortion reference value R. In FIG. 8, P represents the maximum output power that meets the distortion reference value R.

With general RF linear amplifiers as shown here, there is a tendency that the U/D ratio increases with increasing output power. The matching circuit and the bias point of the power amplifier are therefore optimized at the output power P. Unless the bias point is controlled according to the output power, therefore, the characteristic curve will have an inflection point as indicated by a solid line in the graph. The curve is characterized in that as the output power increases, an increase in the U/D ratio temporarily becomes gentle and, depending on circumstances, the ratio temporarily decreases and then increases sharply as shown in FIG. 8. In general, the curve has a tendency to become linear as the operation approaches the class A operation and ascend or descend abruptly as the operation approaches the class B operation.

In power amplifiers, as the operation approaches the class A operation, the distortion decreases but the power addition efficiency declines and, as the operation approaches the class B operation, the distortion increases but the power addition efficiency improves. A tradeoff is involved between distortion and power addition efficiency.

In the class A operation, the load line is formed by the line connecting the points K and C in FIG. 13A. The current Iout(t) becomes sinusoidal and the idle current corresponds to half the amplitude. In the class B operation, the idle current becomes zero at the bias point B. That is, from the point of view of power addition efficiency improvement and idle current reduction, the choice of operation that is close to the. class B operation is favorable.

As is evident from FIG. 8, the displacement of the U/D ratio from the reference value R increases with decreasing output power. At low output power levels, it is therefore important to operate the power amplifier at a deeper bias point (as close to the class B operation as possible).

Figure 1:
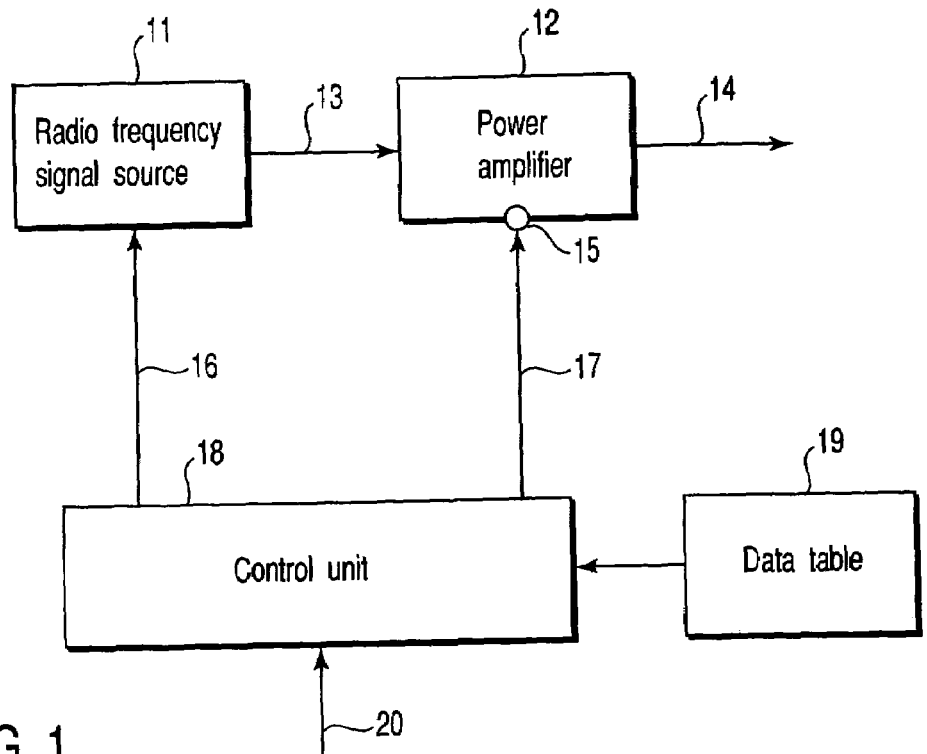
FIG. 1 is a block diagram showing the configuration of a radio frequency circuit according to one embodiment of the present invention.

FIG. 1 shows the configuration of the radio frequency circuit according to the embodiment of the present invention. The radio frequency circuit produces a radio frequency signal, a power amplifier 12 that amplifies the power of the radio frequency signal output from the radio frequency signal source 11, and a control unit 18 that controls the output power of the radio frequency signal source 11 and the output power of the power amplifier 12. In FIG. 1, 13 denotes the radio frequency signal output from the radio frequency signal source 11 and input to the power amplifier 12, 14 denotes the radio frequency signal output from the power amplifier 12, 15 denotes the control terminal of the power amplifier 12, 16 denotes a first control signal supplied from the control unit 18 to the radio frequency signal source 11 to adjust the output power of the radio frequency signal source 11, and 17 denotes a second control signal supplied from the control unit 18 to the control terminal 15 of the power amplifier 12 to adjust the operation bias point of the power amplifier 12. The radio frequency circuit further comprises a data table 19 that stores control data defining a relationship among an operation bias point Vb of the power amplifier 20 and at least two of three items such as the input power Pin, power gain Ga and output power Pout that determine the operation bias point Vb. The control unit 18 receives an output power designating instruction 20 from a controller, such as a CPU, that controls the entire communication system.

The following is an example of the data table 19.

TABLE 19

| Pout (dBmW) | Vb (V) | Pin (dBmW) |
|---|---|---|
| 28.18 | 2.9 | 4 |
| 26.89 | 2.62 | 3.8 |
| 24.9 | 2.66 | 1.8 |
| 22.39 | 2.67 | −0.2 |
| 19.94 | 2.67 | −2.2 |
| 17.38 | 2.67 | −4.2 |
| 14.61 | 2.65 | −6.2 |
| 11.61 | 2.65 | −8.2 |
| 8.23 | 2.62 | −10.2 |
| 5.77 | 2.59 | −11.2 |
| 2.87 | 2.55 | −12.2 |
| −7.64 | 2.35 | −13.2 |
| −13.48 | 2.01 | −14.2 |
| −15.88 | 2.01 | −16.2 |

The control terminal 15 is adapted to set and vary the operation bias point of the power amplifier 12 based on the second control signal 17 supplied to adjust the output power. One example of the control terminal is a terminal which, when the power amplifier 12 is comprised of a common-emitter bipolar transistor, is connected directly or through a bias circuit to the base of the transistor.

In the case of digital control, the second control signal 17 is produced from the control unit 18 as at least two discrete values. The direction of signal currents between the control unit 18 and the control terminal 15 and the driving method (current driving or voltage driving) depend on the internal circuit configuration of the power amplifier 12.

To facilitate the understanding of the present invention, the voltage driving is described herein, which is such that a shallow bias point near the class A area is set on the high level side and a deep bias point near the class B area is set on the low level side. Of course, in actual circuits, this relation may be reversed.

In a case where the power amplifier 12 is comprised of a plurality of stages, the provision of one control terminal for each stage is desirable for fine control. To prevent the explanation from becoming complex, an example of using a single control terminal will be described.

First, the control operation will be described with reference to FIG. 8. Conventionally, the bias point and the matching point are optimized at the maximum output power P so that the U/D ratio exceeds the reference value R for the output power more than the maximum output power P. For convenience sake we shall refer the output power dependence of the U/D ratio and the bias voltage at this time as the conventional U/D ratio and the conventional bias point, respectively. In FIG. 8, there is illustrated the conventional U/D ratio when the second control signal 17 is fixed at the conventional bias point.

The control unit 18 performs control in such a way that the U/D ratio becomes more than the conventional U/D ratio but less than the distortion reference value R at output power levels lower than the maximum output power P.

That is, the second control signal 17 chooses a bias point which is nearer the class B area than the conventional bias point; therefore, the output power that can meet the reference value R falls below the maximum output power P. In general, the nearer the class B area the bias point is, the lower the power gain becomes. In the embodiment, therefore, in order to allow the distortion reference value R to be met even when the operation bias point is changed, two of the output power Pout, the power gain Ga and the input power Pin are stored in the data table 19 for each operation bias point. By having two items of control data selected from the output power Pout, the power gain Ga and the input power Pin, the remaining control data can be determined from the relation such that Pin(dBmW)+Ga(dB)=Pout(dBmW).

In response to the output power designating instruction 20 from the radio communication system, the control unit 18 produces the second control signal 17 to set an optimum operation bias point at which the U/D ratio is below but in the neighborhood of the distortion reference value R. The power gain Ga of the power amplifier 12 is then determined. Thus, the input power Pin of the power amplifier 12, i.e., the power of the radio frequency signal 13, is adjusted based on the first control signal so as to satisfy Pin(dBmW)+Ga(dB)=Pout(dBmW).

In the embodiment, the voltage of the second control signal 17 is lowered for an output power lower than the maximum output power P, thereby setting the operation bias point of the power amplifier 12 in the class B area deeper than the conventional bias point.

The contents of the data table 19 are determined in the following manner. When the power amplifier 12 is determined to be used in the radio communication system, one of its input power Pin, output power Pout and power gain Ga is decided and then conditions under which another satisfies the distortion reference value R are measured. For example, the input power Pin is decided by means of the first control signal, and the bias point is adjusted through the second control signal 17 to search for a value for which the U/D ratio satisfies the distortion reference value R. The output power Pout is measured for the input power Pin and the bias point. The gain Ga is obtained by the aforementioned relationship, that is, Pin(dBmW)+Ga(dB)=Pout(dBmW).

The radio frequency signal source 11 includes at least an output adjusting unit, such as a gain controlled amplifier or attenuator. In addition, it may further contain a baseband unit, a D/A converter, a modulator, an upconverter, etc. The radio frequency signal 13 has its power controlled by the output adjusting unit and then input to the power amplifier 12.

In order to control the power of the radio frequency signal 14 output from the power amplifier 12, the control unit 18 produces the first and second control signals that control the radio frequency signal source 11 and the power amplifier 12, respectively. When there is no need of outputting the radio frequency signal 14, the radio frequency signal source 11 and the power amplifier 12 are switched OFF (shut down) so as to eliminate power dissipation.

Upon reception of the output power designating instruction 20 from the controller, such as a CPU, that controls the operation of the entire communication system, the control unit 18 reads from the data table 19 the input power Pin of the power amplifier 12 and the bias point for the power gain Ga of the power amplifier 12 corresponding to the output power designating instruction 20. Thus, if the contents of the data table 19 are formed of a combination of the input power Pin and the power gain Ga or the output power Pout and the power gain Ga, but not a combination of the input power Pin and the output power Pout, the remaining data is determined from the relation among Pin, Pout and Ga.

Since the contents of the data table 19 are discrete data, the control unit 18 interpolates these data by an interpolation method such as linear interpolation or spline interpolation, as required. The interpolation may be performed through either anti-logarithm or logarithm.

In the radio frequency circuit of the embodiment, upon reception of the output power designating instruction 20, the control unit 18 refers to the data table in order to control the output power Pout of the power amplifier 12 in accordance with the output power designating instruction 20. That is, the control unit obtains the input power Pin of the power amplifier 12 for the output power Pout designated by the output power designating instruction 20 and then produces the first control signal 16 for the input power Pin. The output power of the radio frequency signal source 11 is specified by the first control signal 16. Further, the control unit 18 obtains the power gain Ga for the output power Pout designated by the output power designating instruction 20 and then produces the second control signal 17 for the power gain Ga. The operation bias point of the power amplifier 12 is specified by the second control signal 17. Here, as described previously, the second control signal 17 has its voltage lowered at output power levels lower than at maximum output power P. As a result, at all output power levels the operation bias point can be set in the class B area deeper than the conventional bias point within the range in which the distortion reference value R is satisfied.

Further, the control unit 18 sets, through the second control signal 17, the operation bias point not only in the class B area deeper than the conventional bias point but also in the area near pinch-off (cutoff region) in order to perform gain control for lowering the power gain Ga of the power amplifier 12. Thereby, the power amplifier 12 is placed in the through state to allow the radio frequency signal to pass through without any power gain, which results in a significant reduction in consumption current of the power amplifier 12 such as the idle current in class AB amplification. Thus, the consumption current of the entire radio communication system that requires transmission power control can be reduced significantly.

Figure 2:
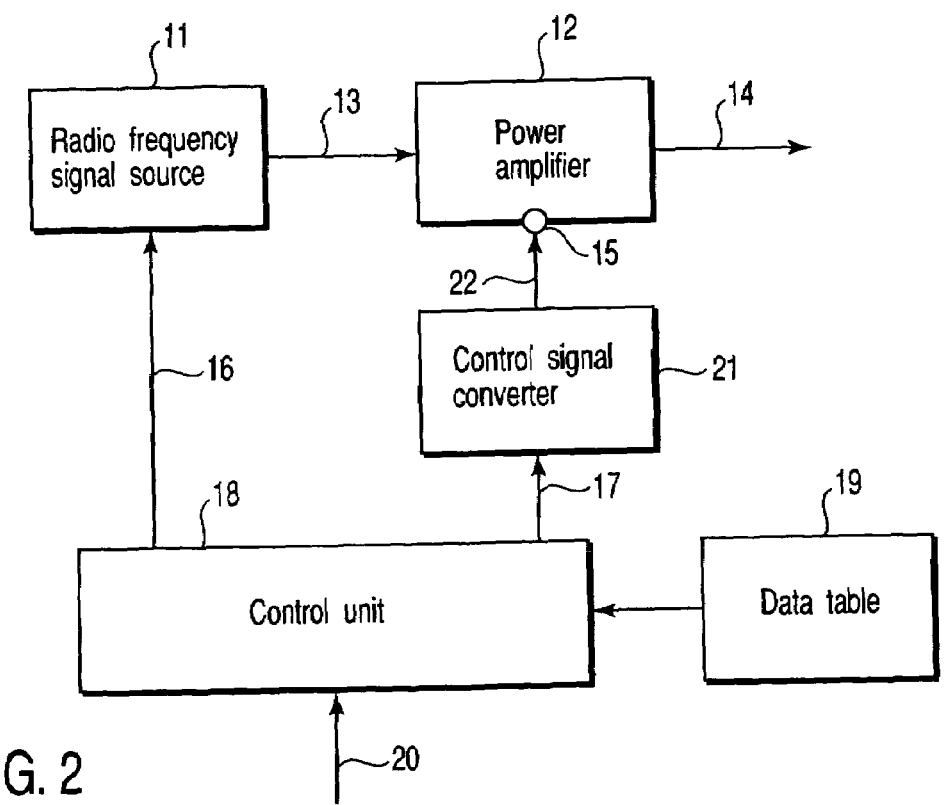
FIG. 2 a block diagram showing a modification of the radio frequency circuit of FIG. 1.

FIG. 2 shows a modification of the radio frequency circuit shown in FIG. 1. This modification is similar to the radio frequency circuit shown in FIG. 1 except for a temperature compensation configuration for the power amplifier 12. Thus, similar parts to those in FIG. 1 are denoted by the same reference numerals and descriptions thereof are omitted.

In this modification, the control unit 18 supplies the second control signal 17 to a control signal converter 21 in place of the control terminal 15 of the power amplifier 12. The control signal converter 21 converts the second control signal 17 into a third control signal to serve as a bias circuit for temperature compensation of the power amplifier 12, and supplies the third control signal to the control terminal 15 of the power amplifier 12. Although, in FIG. 2, the control signal converter 21 is provided independently of the power amplifier 12, they may be incorporated into one package, module, or integrated circuit.

Figure 3:
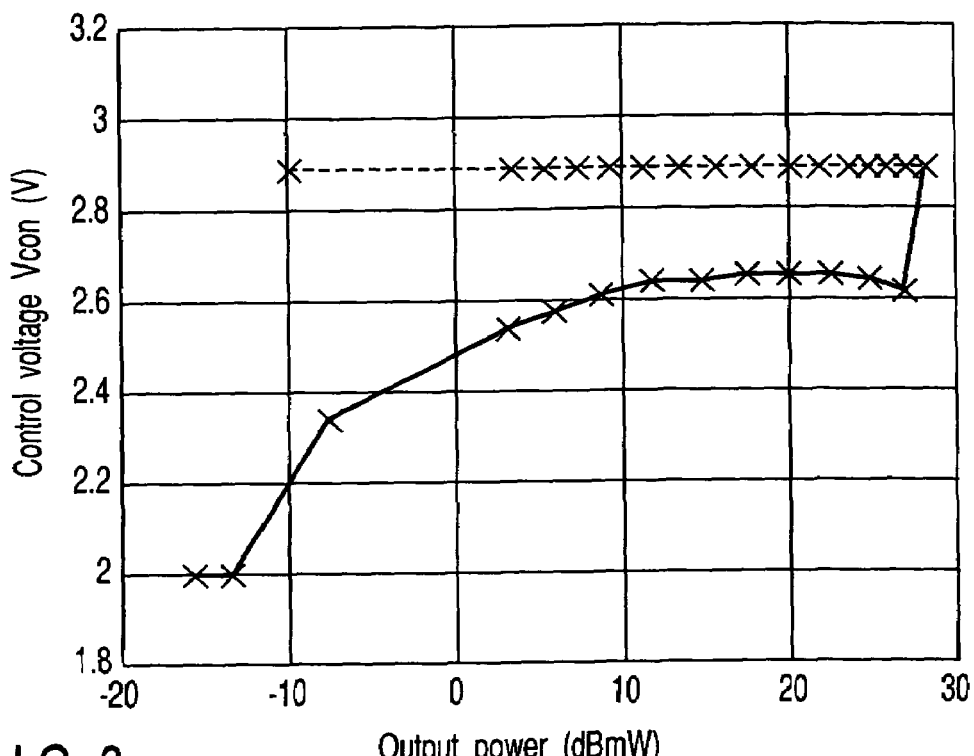
FIG. 3 is a graph showing the control voltage—output power characteristic of the radio frequency circuit shown in FIG. 1.
Figure 4:
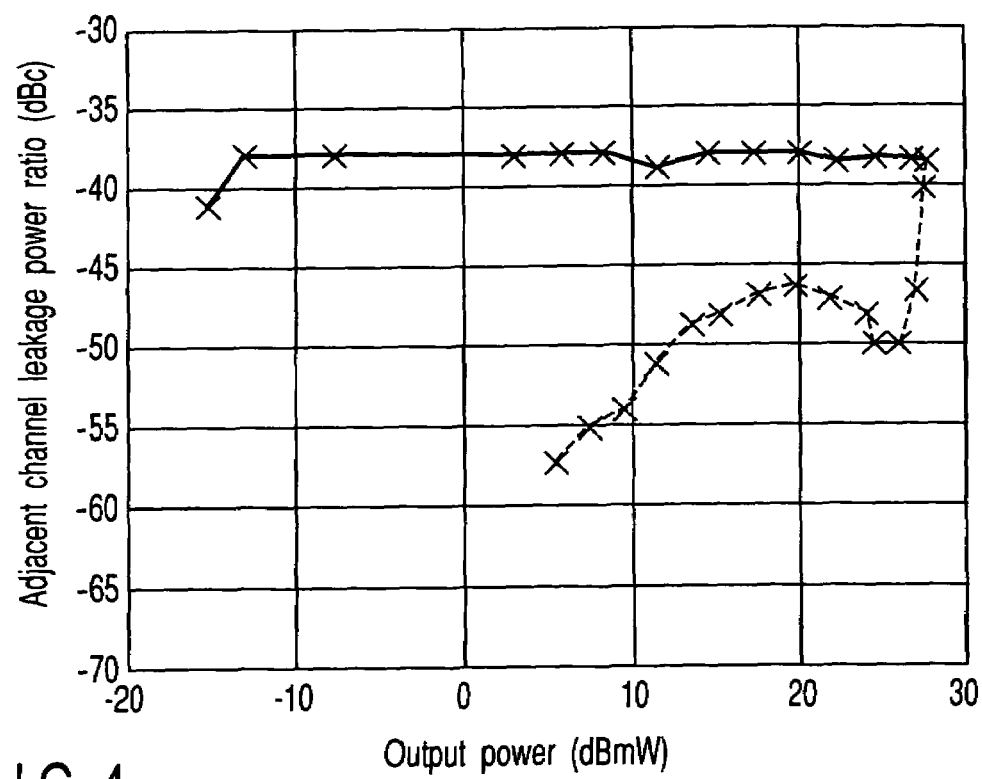
FIG. 4 is a graph showing the adjacent channel leakage power—output power characteristic of the radio frequency circuit shown in FIG. 1.

The results of experiments on the radio frequency circuit shown in FIG. 1 with the distortion reference value taken as −38 dBc are shown in FIGS. 3 to 6. FIG. 3 shows the control voltage—output power characteristic of the power amplifier 12 and FIG. 4 shows the adjacent channel leakage power—output power characteristic of the power amplifier 12. The control voltage is conventionally fixed to a level indicated by a dotted line. Thus, the adjacent channel leakage power decreases with decreasing output power and takes values much lower than the reference value (=−38 dBc). In contrast, in the embodiment, the second control signal 17 is input as a control voltage to the control terminal 15 of the power amplifier 12. The control voltage changes, as indicated by a solid line, from 2.9 to 2 V with decreasing output power with the adjacent channel leakage power kept at −38 dBc. Thereby, the power gain of the power amplifier 12 is varied accordingly.

Figure 5:
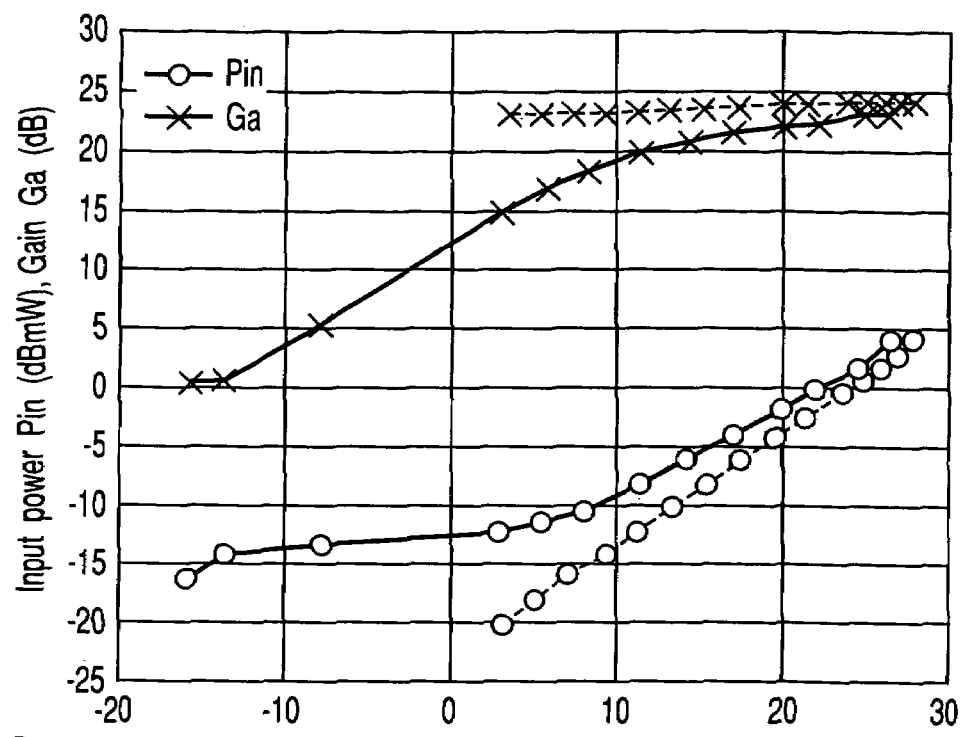
FIG. 5 is a graph showing the power gain—output power characteristic and the input power—output power characteristic of the radio frequency circuit shown in FIG. 1.

FIG. 5 shows the power gain—output power characteristic and the input power—output power characteristic of the power amplifier 12. The control voltage is conventionally fixed. Thus, the power gain Ga indicated by a dotted line depends little on the output power. In contrast, in the embodiment, the power gain Ga is lowered to the neighborhood of 0 dB at low output power levels and hence can be controlled over a range of 25 dB.

In the embodiment, the input power Pin is limited in accordance with the control voltage so as to satisfy the reference value, −38 dBc, of the adjacent channel leakage power.

Figure 6:
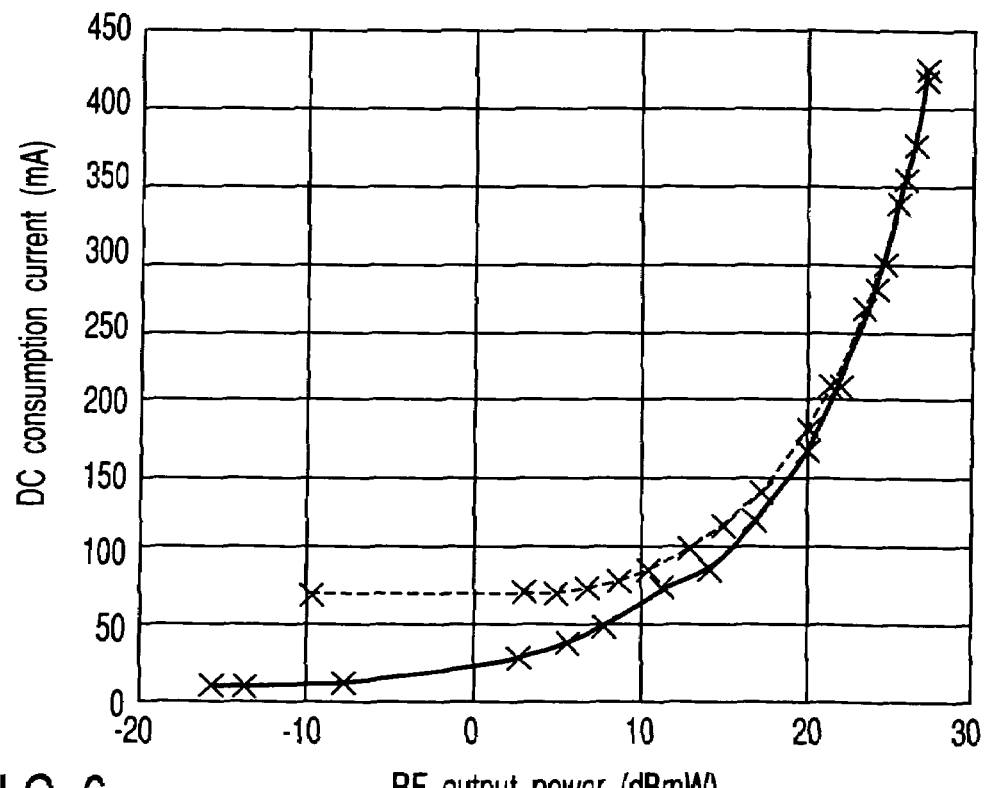
FIG. 6 is a graph showing a relationship between the consumption current and the output power of the radio frequency circuit shown in FIG. 1.

FIG. 6 shows a relationship between the consumption current and the output power of the radio frequency circuit 12. The control voltage is conventionally fixed. Thus, the consumption current approaches an idle current of 70 mA at low output power levels, as indicated by a dotted line. In the embodiment, the consumption current is reduced to 7 mA which is about 1/10 of the idle current. As a result of evaluating this result using the probability density function of transmission power, the consumption current can be reduced by up to 50%.

As can be seen from FIGS. 5 and 6, according to the embodiment, by reducing the power gain Ga by 9 dB from 24 to 15 dB to make the output power less than ⅛ of the maximum output power, the consumption current can be reduced remarkably. Further, by lowering the power gain Ga down to 6 dB, the consumption current can be further reduced. Even if the power gain Ga lies in the range of 0 to −3 dB, the consumption current can be reduced. That is, when the power gain Ga is set at about 0 dB in the range of 6 to −3 dB, the consumption current can be further decreased. In this embodiment, the data table 19 is referred to even if temperature or frequency fluctuates. It is desirable to refer to other tables which are prepared to cope with fluctuation of temperature and frequency, as required.

As described above, the radio frequency circuit according to the embodiment is especially suitable for systems that require a power amplifier having a wide range of output power. For example, the circuit is useful for communication with mobiles or, even with communication between fixed stations, when the radio wave propagation environment is liable to variations. In particular, the circuit is well-suited for mobile communication systems for portable phones, radio access systems exemplified by radio LAN equipment, and, most of all, CDMA (Code Division Multiple Access)-based systems that require a wide dynamic range.

Next, an example in which a radio communication system shown in FIG. 1 is applied to a terminal device of the mobile communication system will be described. FIG. 7A shows the configuration of the terminal device of the mobile communication system. The terminal device comprises, as shown in FIG. 7A, a transceiver 100 and antennas 101 and 102 coupled to the transceiver 100. The transceiver 100 includes an antenna switch 103 for switching between the antennas 101 and 102, an amplifier 104 for amplifying radio frequency signals to be radiated by the antennas 101 and 102, an amplifier 105 for amplifying radio frequency signals received by the antennas 101 and 102, a modulator 106 for modulating a radio frequency signal to be supplied to the amplifier 104, a demodulator 108 for demodulating a radio frequency signal from the amplifier 105, and a radio frequency synthesizer 107 for producing frequencies for transmission and reception. The amplifier 104 is formed of the radio frequency circuit described in conjunction with FIG. 1. The terminal device further comprises an input and output unit 110 that serves as an interface with input and output signals, a baseband signal processor 109 that performs baseband signal transformation processing between the input and output unit 110 and the transceiver 100, and a control unit 111 that controls the input and output unit 110 and the transceiver 100. The transceiver 100, the baseband signal processor 109 and the input, and output unit 110 are operated from the supply voltage of a power supply 112. The input and output unit 110 includes a microphone 110a that enters audio signals such as voice, a keypad 110d that enters characters such as letters, numerals and the like, a loudspeaker 110b that outputs audio signals such as voice in the form of sound energy, a display 110c that displays letters, numerals, and graphic images, a vibrator 110e that produces vibrations, and a data input and output module 110f that electrically, magnetically, or optically inputs and outputs various pieces of data. The data input and output module 110f corresponds to a Bluetooth module, an interface for peripheral equipment such as USB or IEEE1394, an interface for a memory card such as a CF (Compact Flush) card or a SD (Super Density) card, or an interface for connection to a host such as a personal digital assistant (PDA) or a personal computer.

In this terminal device, various signals are input from the microphone 110a, the keypad 110d, and the data input and output unit 110f in the input and output unit 110. These signals are processed in the baseband signal processor 109, and then modulated in the modulator 106 and applied to the amplifier 104 as radio frequency signals under the control of the control unit 111. The amplifier 104 processes the radio frequency signal from the modulator 106 in the same manner as the radio frequency circuit shown in FIG. 1 and outputs it as a transmission radio frequency signal to be transmitted from the antennas 101 and 102 through the antenna switch 103.

A radio frequency signal received by each of the antennas 101 and 102 is amplified in the amplifier 105 and then demodulated in the demodulator 108 into a baseband signal, which is in turn converted by the baseband signal processor 108 into a control signal that controls the loudspeaker 110b, the display 110c, the vibrator 110e, or the data input and output module 110f. These operations are made under the control of the control unit 111.

Here, an example in which the radio frequency circuit shown in FIG. 1 is applied to a base station device of the mobile communication system will be described. FIG. 7B shows the configuration of the base station device of the mobile communication system. As shown in FIG. 7B, the base station device comprises a plurality of transceivers 200 and pairs of antennas 201 and 202, each pair being coupled to a corresponding one of the transceivers 200. Each of the transceivers 200 includes an antenna switch 203 for switching between the antennas 201 and 202 of a corresponding pair, an amplifier 204 for amplifying radio frequency signals to be radiated by the antennas 201 and 202, an amplifier 205 for amplifying radio frequency signals received by the antennas 201 and 202, and a modulation and demodulation module 206 for modulating a radio frequency signal to be supplied to the amplifier 204 and demodulating a radio frequency signal from the amplifier 205. The amplifier 204 is formed of the radio frequency circuit described in conjunction with FIG. 1. The base station device further comprises a baseband signal processor 207, a network interface 208, and a control unit 209. The network interface 208 makes connection between channels. The baseband signal processor 207 performs baseband signal transformation processing between the network interface 208 and the transceivers 200. The control unit 209 controls the baseband signal processor 207, the network interface 208, and the transceivers 200. The transceivers 200, the baseband signal processor 207 and the network interface 208 are operated from the supply voltage from a power supply 210.

In this base station device, an external signal input through the network interface 208 is processed in the baseband signal processor 207, then modulated in the modulation and demodulation module 206 and applied to the amplifier 204 as a radio frequency signal. The amplifier 204 processes the radio frequency signal from the modulation and demodulation module 206 in the same manner as the radio frequency circuit shown in FIG. 1 and outputs it as a transmit radio frequency signal to be transmitted from the antennas 201 and 202 through the antenna switch 203.

A radio frequency signal received by each of the antennas 201 and 202 is amplified in the amplifier 205 and then demodulated in the modem 206 into a baseband signal, which is in turn converted by the baseband signal processor 207 into a control signal and then output to the outside. These operations are made under the control of the control unit 209.

According to the aforementioned radio frequency circuit, the consumption current in a power amplifier for a control of transmission power can be reduced to $\frac{1}{10}$ of that in the conventional circuit at low output power levels. This excellent characteristic allows the effective average consumption current associated with output power control to be reduced by up to 50%. The circuits necessary for the radio frequency circuit can be integrated into an MMIC or LSI chip, allowing the inventive radio frequency circuit to be applied to the power amplifier in portable phones required to be small and inexpensive.

The aforementioned embodiment can be modified. For example, instead of using the data table 19 of FIG. 1, control data which define a relationship of at least two of the input power, power gain and output power and the corresponding operation bias point may be provided in the form of a function described by a software program. These control data may be output in analog form through hardware such as operational amplifiers.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:

1. A communication system comprising:
   a radio frequency circuit which includes a radio frequency signal source which produces a radio frequency signal, a power amplifier which power amplifies the radio frequency signal from said radio frequency signal source, and a control unit which controls an output power of the power amplifier; and
   an antenna which radiates the radio frequency signal output from the power amplifier of said radio frequency circuit; said control unit being configured to hold control data defining a relationship among an operation bias point of said power amplifier and at least two of an input power, and a gain and the output power of said power amplifier, and to adjust the operation bias point of said power amplifier based on the control data such that the output power of said power amplifier is set into a level designated by an external power designating instruction;
   wherein when the external power designating instruction designates a maximum output power of said power amplifier, said operation bias point is adjusted to a value nearer a class B area than that for the maximum output power within a range that a ratio of an undesired signal component to a desired signal component of the radio frequency signal from said power amplifier is maintained below a distortion reference value specified for a radio communication system, and said control data are referred to for controlling the sum of the input power and the gain of said power amplifier to be equal to the output power of said power amplifier.

2. The communication system according to claim 1, wherein said control unit is further configured to change an output power of said radio frequency signal source based on the control data.

3. The communication system according to claim 1, wherein said control unit includes a data table storing control data.

4. The communication system according to claim 1, wherein said control unit includes a software program described as a function of producing the control data.

5. The communication system according to claim 1, wherein said control unit includes a hardware that outputs the control data in an analog form.

6. A communication system comprising:
   a radio frequency circuit which includes a radio frequency signal source which produces a radio frequency signal, a power amplifier which power amplifies the radio frequency signal from said radio frequency signal source, and a control unit which controls an output power of the power amplifier; and
   an antenna which radiates the radio frequency signal output from the power amplifier of said radio frequency circuit; said control unit being configured to hold control data defining a relationship among an operation bias point of said power amplifier and at least two of an input power, and a gain and the output power of said power amplifier, and to adjust the operation bias point of said power amplifier based on the control data such that the output power of said power amplifier is set into a level designated by an external power designating instruction;
   wherein said control data are results obtained by measuring at least two of the input power, power gain and output power which define every operation bias point allowing said power amplifier to serve as a class A to B amplifier within a range that a ratio of an undesired signal component to a desired signal component of the radio frequency signal from said power amplifier is maintained below and in the neighborhood of a distortion reference value specified for a radio communication system with respect to an entire output power range of said power amplifier, and said control data are referred to for controlling the sum of the input power and the gain of said power amplifier to be equal to the output power of said power amplifier.

7. A communication system comprising:
   a radio frequency circuit which includes a radio frequency signal source which produces a radio frequency signal, a power amplifier which power amplifies the radio frequency signal from said radio frequency signal source, and a control unit which controls an output power of the power amplifier; and
   an antenna which radiates the radio frequency signal output from the power amplifier of said radio frequency circuit; said control unit being configured to hold control data defining a relationship among an operation bias point of said power amplifier and at least two of an input power, and a gain and the output power of said power amplifier, and to adjust the operation bias point of said power amplifier based on the control data such that the output power of said power amplifier is set into a level designated by an external power designating instruction; wherein said control unit is configured to obtain first and second control signals based on the control data when the output power designating instruction designates a maximum output power of said power amplifier, said first control signal adjusting the output power of said power amplifier to a maximal level in which a ratio of an undesired signal component to a desired signal component of the radio frequency signal from said power amplifier is maintained below a distortion reference value specified for a radio communication system, said second control signal adjusting the output power of said radio frequency signal source to a level in which a power gain of said power amplifier becomes less that $\frac{1}{8}$ of that for the maximum output power, and said control data are referred to for controlling the sum of the input power and the gain of said power amplifier to be equal to the output power of said power amplifier.

8. The communication system according to claim 7, wherein said control unit is configured to perform interpolation of the control data in production of the first and second control signals.

9. The communication system according to claim 7, wherein said control unit includes a control signal converter that converts the first control signal into a third control signal by which a temperature of said power amplifier is additionally compensated for.

* * * * *